United States Patent [19]

Sakaguchi

[11] Patent Number: 5,265,330
[45] Date of Patent: Nov. 30, 1993

[54] METHOD OF PACKAGING CHIP ON SUBSTRATE

[75] Inventor: Shinsuke Sakaguchi, Fukuoka, Japan

[73] Assignee: Matsushita Electric Industrial Co., Ltd., Japan

[21] Appl. No.: 888,700

[22] Filed: May 27, 1992

[30] Foreign Application Priority Data

May 28, 1991 [JP] Japan .................................. 3-123641

[51] Int. Cl.⁵ .................................................. H05K 3/30
[52] U.S. Cl. ........................................ 29/836; 29/740; 29/759; 29/832
[58] Field of Search ................... 29/740, 833, 836, 832, 29/759

[56] References Cited

U.S. PATENT DOCUMENTS

| | | | |
|---|---|---|---|
| 4,807,356 | 2/1989 | Maruyama et al. | 29/739 X |
| 5,060,366 | 10/1991 | Asai et al. | 29/83.6 X |
| 5,086,559 | 2/1992 | Akatsuchi | 29/833 X |
| 5,136,776 | 8/1992 | Yanagisawa | 29/740 |

Primary Examiner—Carl J. Arbes
Attorney, Agent, or Firm—Lowe, Price, LeBlanc & Becker

[57] ABSTRACT

A method of packaging each of chips on a substrate within each of different cycle time periods through a packaging device driven by a motor, the packaging device being arranged to pick up the chip and carrying it to the substrate for the packaging, the method comprises the step of gradually decreasing a rotational speed of the motor when the cycle time period is changed to be longer and gradually increasing the rotational speed of the motor when the cycle time period is changed to be shorter. This method can package chips at a high speed on the substrate without increasing the capacity of the motor.

2 Claims, 1 Drawing Sheet

METHOD OF PACKAGING CHIP ON SUBSTRATE

BACKGROUND OF THE INVENTION

The present invention relates to a method of packaging a chip such as an electronic component on a substrate.

Conventionally, as a means for packaging a chip on a substrate there is known a technique where a mounting head attached to a rotary head to be movable and rotatable picks up a chip from a movable parts feeder to carry and mount the chip toward and on a substrate positioned by an X-Y table assembly. This chip packaging operation is arranged to be effected within a cycle time period. The cycle time period depends upon the operating condition, that is, for example, when the moving distances of the X-Y table assembly and the parts feeder are short, the cycle time period also becomes shorts, and on the other hand, when the moving distances thereof are long, the cycle time period naturally becomes long. Further, in the case of a chip with leads such as QFP, the chip packaging operation takes a longer time as compared with the case of a rectangular chip such as a resistor chip and a capacitor chip because time is taken for detection of a positional deviation of the chip by an optical means. Accordingly, when the cycle time period varies in accordance with the operating condition, the rotational speed of a driving motor for rotating the mounting head is required to be accelerated and decelerated in accordance with the variation of the cycle time period.

On the other hand, for realizing the high-speed packaging of the chip, the cycle time period is preferable to be set to be as short as possible. The shortening of the cycle time period results in the fact that the acceleration and deceleration of the driving motor are performed within the short cycle time period, and hence the driving motor is needed to have a large capacity to allow generation of a large torque. However, there is a limit in the capacity of the driving motor, thereby making it difficult to shorten the cycle time period.

SUMMARY OF THE INVENTION

It is therefore an object of the present invention to provide a chip packaging method which is capable of packaging a chip at a high speed without increasing the capacity of the head driving motor.

According to this invention, In a method of packaging each of chips on a substrate within each of different cycle time periods through a packaging device driven by a motor, the packaging device being arranged to pick up the chip and carrying it to the substrate for the packaging, the rotational speed of the motor is gradually decreased when the cycle time period directs from a shorter period to a longer period and the rotational speed of the motor is gradually increased when the cycle time period directs from a longer period toward a shorter period.

BRIEF DESCRIPTION OF THE DRAWINGS

The object and features of the present invention will become more readily apparent from the following detailed description of the preferred embodiments taken in conjunction with the accompanying drawings in which.

DETAILED DESCRIPTION OF THE INVENTION

Figure 1:
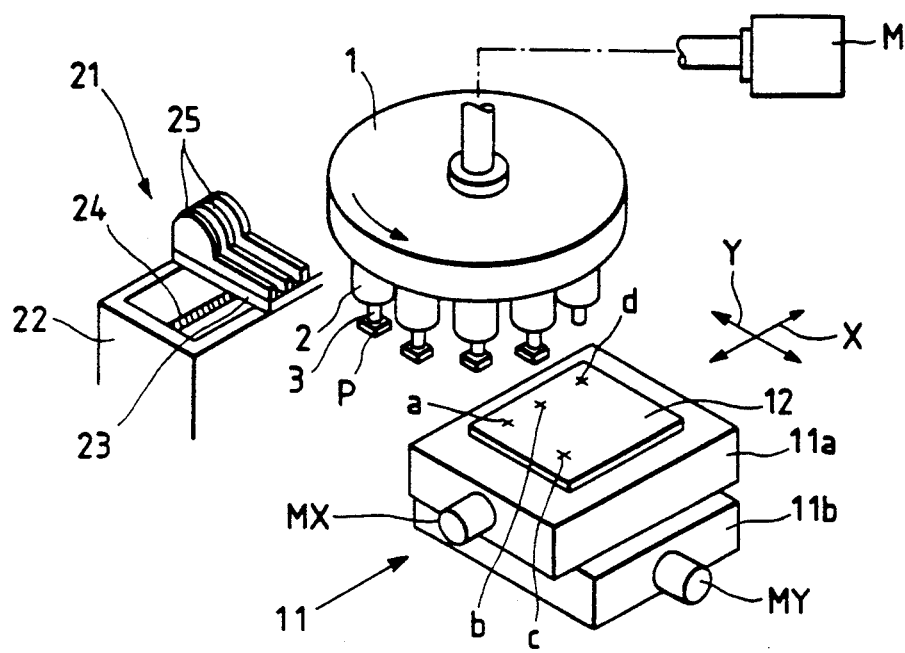
FIG. 1 shows an arrangement of a chip packaging system according to an embodiment of the present invention.

FIG. 1 shows an arrangement of a chip packaging system according to an embodiment of the present invention. In FIG. 1, designated at numeral 1 is a rotary head which is index-rotatable in a direction indicated by an arrow by means of a drive motor M. The rotary head 1 is at its lower surface equipped with a plurality of mounting heads 2 which are successively arranged along the circumference of the lower surface and each of which has a suction nozzle 3 extending downwardly. The suction nozzle 3 is arranged to suck and pick up a chip P for carrying and mounting it to and on a substrate 12. Further, designated at numeral 11 is an X-Y table assembly comprising an X table 11a, a Y table 11b, an X-direction driving motor MX and a Y-direction driving motor MY. On the X-Y table assembly 11 there is placed and positioned the substrate 12. In addition, denoted at numeral 21 is a chip feeding apparatus comprising a table moving device 22, a moving table 23 mounted on the table moving device 22 to be slidable, and a ball screw 24 for reciprocating the moving table 23 in X directions. On the moving table 23 there are disposed a plurality of parts feeders 25 such as tape feeders. With the moving table 23 being moved in the X directions, the parts feeder encasing a target chip P is shifted to a pickup position directly under the mounting head 2. The mounting head 2 first sucks and picks up the chip P from the parts feeder 25 and the rotary head 1 then index-rotates in the arrow direction, thereby carrying and mounting the chip P to and on the substrate 12.

The substrate 12 is movable in the X and Y directions and the moving amount of the substrate 12 depends upon the operating condition. More specifically, for example, in the case that the packaging position of the chip P is changed from a point a to a point b, the moving amount is relatively short whereby the cycle time period taken for carrying and mounting the chip P to and on the substrate 12 becomes short. On the other hand, in the case that the packaging position of the chip P is changed from a point c to a point d, the moving amount thereof is relatively long and hence the cycle time period becomes long. The cycle time period varies in accordance with the moving amount of the parts feeder 25, the kind of the chip P and others. Further, in accordance with the variation of the cycle time period, the rotational speed of the motor M for driving the rotary head 1 is accelerated and decelerated (increased and decreased).

Figure 2:
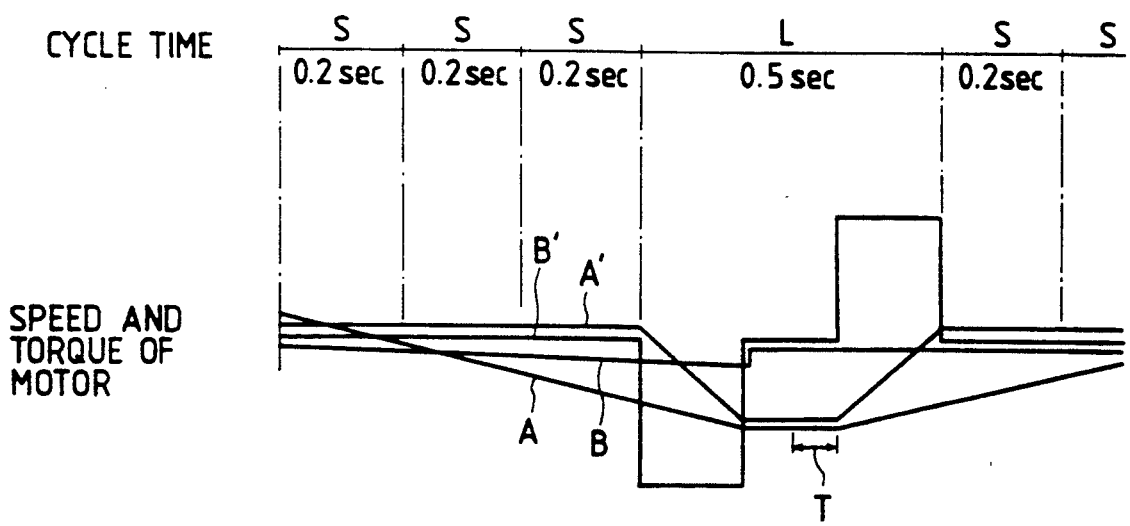
FIG. 2 is a graphic diagram for describing an operation of a rotary-head driving motor.

FIG. 2 is a graphic diagram for describing a chip packaging method according to this invention and shows the relation between the cycle time periods, the motor M speed and the torque. In FIG. 2, character S represents a relatively short cycle time period (for example, 0.2 sec), character L designates a relatively long cycle time period (for example, 0.5 sec). Further, a line A shows the variation of the motor M speed in this embodiment, a line B shows the variation of the motor M torque in this embodiment, a line A' indicates the variation of the motor speed in a conventional method, and a line B' indicates the variation of the torque in the conventional method.

According to this embodiment, as indicated by the line A in FIG. 2, the motor M speed is gradually accelerated and decelerated through a plurality of cycle time periods with respect to the long cycle time period L. More specifically, in the case of taking the long cycle time period L after taking the short cycle time period (cycle time periods) S, the speed of the motor M is gradually decelerated from a point of a short cycle time period S up to a point of time within the long cycle time period L, and in the case of taking the long cycle time period L before taking the short cycle time period (periods) S, the speed of the motor M is gradually accelerated from a point of time within the long cycle time period L toward a short cycle time period S. In other words, the motor M speed is gradually decreased when directing from the short cycle time packaging operation toward the long cycle time packaging operation, and it is gradually increased when directing from the long cycle time packaging operation toward the short cycle time packaging operation.

With such control, as indicated by the line B in FIG. 2, the variation of the torque extremely becomes small as compared with the case of the conventional method indicated by B' in FIG. 2. According to this embodiment, unlike the conventional method, this embodiment does not require a motor having a large capacity, thereby allowing the reduction of the cycle time period.

In this embodiment, the packaging of the chips P on the substrate 12 is performed under control of a computer program, and hence the cycle time periods for the chips P to be packaged are previously determined in order to the packaging. Thus, the acceleration and deceleration of the motor M speed can be set in accordance with the program.

It should be understood that the foregoing relates to only preferred embodiments of the present invention, and that it is intended to cover all changes and modifications of the embodiments of the invention herein used for the purposes of the disclosure, which do not constitute departures from the spirit and scope of the invention.

What is claimed is:

1. A method of packaging each of a plurality of chips on a substrate within different cycle time periods utilizing a packaging device which is driven by a motor in such a manner so as to pick up each of said plurality of chips individually and carry each of said individual chips to said substrate, said method comprising the step of gradually decreasing the rotational speed of said motor during a cycle having a first time period when said cycle having a first time period is followed by cycle having a longer time period.

2. A method as claimed in claim 1, wherein said rotational speed of said motor is gradually increased during said cycle having said first time period when said cycle having said first time period is followed by cycle having a shorter time period.

* * * * *